United States Patent [19]

Hack

[11] Patent Number: 4,903,266
[45] Date of Patent: Feb. 20, 1990

[54] MEMORY SELF-TEST
[75] Inventor: George E. Hack, Tucson, Ariz.
[73] Assignee: International Business Machines Corporation, Armonk, N.Y.
[21] Appl. No.: 187,708
[22] Filed: Apr. 29, 1988
[51] Int. Cl.$^4$ ............................................. G06F 11/00
[52] U.S. Cl. .................................. 371/21.2; 371/22.4; 364/717
[58] Field of Search ..................... 371/21, 25, 27, 15, 371/21.1, 21.2, 21.3, 21.4, 21.5, 21.6, 25.1, 22.4, 15.1; 365/201; 364/717; 324/73 R

[56] References Cited

U.S. PATENT DOCUMENTS

| | | | |
|---|---|---|---|
| 3,761,695 | 9/1973 | Eichelberger | 235/153 |
| 3,783,254 | 1/1974 | Eichelberger | 235/152 |
| 4,433,413 | 2/1984 | Fasang | 371/25 |
| 4,513,418 | 4/1985 | Bardell Jr. et al. | 371/25 |
| 4,519,078 | 5/1985 | Komonytsky | 371/25 |
| 4,597,080 | 6/1986 | Thatte et al. | 371/25 |
| 4,601,034 | 7/1986 | Sridhar | 371/25 |
| 4,688,223 | 8/1987 | Motika | 371/25 X |
| 4,715,034 | 12/1987 | Jacobson | 371/21 |
| 4,764,926 | 8/1988 | Knight | 371/25 |
| 4,782,487 | 11/1988 | Smelser | 371/21 |

OTHER PUBLICATIONS

*VLSI Systems Design*, Dec. 1986, "Feedback Shift Registers for Self-Testing Circuits", by L. T. Wang et al., pp. 50–58.
*IEEE Design & Test*, Apr. 1985, "Built-In Self-Test Techniques", by E. J. McCluskey, pp. 21–28.
*IEEE Transactions on Computers*, vol. C-30, No. 11, Nov. 1981, "Design for Autonomous Test", by E. J. McCluskey et al., pp. 866–875.
*IEEE Transactions on Computers*, vol. C-35, No. 7, Jul. 1986, "Pseudorandom Arrays for Built-In Tests", by P. H. Bardell et al., pp. 653–658.

*Primary Examiner*—Jerry Smith
*Assistant Examiner*—Robert W. Beausoliel
*Attorney, Agent, or Firm*—Manny W. Schecter

[57] ABSTRACT

A system and method for on-chip self test of memory circuits is disclosed. Memory circuit testing is accomplished by using a random pattern generator based upon a primitive polynomial and including a linear feedback shift register having at least one stage in addition to the number of address lines required for addressing the memory. The random pattern generator is capable of cycling through all memory addresses, including the all zero address. During each of four random pattern generator cycles, known data is written in or read out of each memory cell. By including means for writing and reading the complement of data during different random pattern generator cycles, both possible states of each memory cell may be tested. The outputted data is routed to multiple input signature register which generates a data signature for the memory which can in turn be compared to that known for a good memory. Logic circuit testing may also be accomplished using a known level sensitive scan design technique, the test output data also being outputted to the multiple input signature register. A single data signature may then be generated which is indicative of the good or bad status of both the logic and memory circuits.

10 Claims, 1 Drawing Sheet

MEMORY SELF-TEST

BACKGROUND OF THE INVENTION

1. Field of the Invention

This invention relates to a system and method for high-efficiency memory self-test. More particularly, the invention is an on-chip system and method for performing self-test of either or both logic and memory circuits.

2. Description of the Related Art

Numerous methods have been proposed for the testing of integrated circuitry. Typically, a black box technique is used. In this technique, a circuit is provided with a deterministic stimulus, thereby generating a response from the circuit, which is compared to a known expected output. Based on the comparisons, the circuit is determined to be simply good or bad. Past problems with the testing of integrated circuitry are the large test data volumes and long test times.

Self-test refers to the presence of testing circuits which are on a component containing the circuits to be tested. The component may be a card, wafer, or an integrated circuit chip. Thus, self-test may be accomplished with testing circuits integrated into the circuits to be tested (i.e., on-chip), or located externally on the component (i.e., off-chip). The choice between on-chip and off-chip testing requires balancing two competing factors. Off-chip testing is advantageous because the testing circuits need not be reproduced with the production of each integrated circuit chip. On-chip testing is considered advantageous because of its closeness to the circuits being tested, thereby making testing available at significantly higher speeds than for off-chip testing and requiring little more than an external power supply therefor. In recent years, the balance has swung in favor of on-chip testing because the increase in integrated circuit density available has reduced the emphasis on chip real estate and increased the emphasis on testing speed.

On-chip circuit testing can be divided into areas of logic circuit testing and memory circuit testing. For both types of on-chip testing it is desirable to be able to test all storage points in both the logical zero and one states. Due to recent increases in on-chip circuit density, it is becoming more likely that integrated circuit chips will contain both logic and memory circuits. Thus, there is an increasing need to be able to test both logic circuits and memory circuits on the same chip. However, most known circuit testing techniques are directed merely to the testing of logic circuits.

The problem presented by the testing of logic circuits is the accessibility and observability of the logic circuit storage elements (latches). These storage elements are typically intertwined in such a manner that data cannot be inputted into a particular logic circuit storage element independently of other storage elements. Control of the independent logic circuit storage elements is required for logic circuit testing so that a known stimulus can be provided to the logic circuits, and the results can be observed. This problem has been solved by level sensitive scan design (LSSD) techniques. LSSD techniques are widely known, as described, for example, in U.S. Pat. Nos. 3,761,695 or 3,783,254.

LSSD testing is implemented by imparting a shift register capability to each of the logic system latches and by making these shift register latches (SRL's) accessible during an input/output mode. LSSD testing requires operation of the logic circuits in two separate modes. In the first mode, known test data is serially inputted and shifted to the appropriate SRL locations. With the SRL initialized to a known state, operation of the logic circuits in the second mode begins. Known test data is thus propagated through the logic circuits to act as a stimuli to the system, the results being captured in the SRL's. Upon reversion to the original mode of operation, the status of the SRL's can be outputted and compared with known data which would be present if the circuitry operated correctly.

LSSD logic circuit testing is convenient because it permits sequential logic to be tested as combinatorial logic. In recent years, however, such "deterministic" circuit testing has become increasingly expensive. Circuit density has increased so rapidly that it is no longer feasible to provide for input/output (i.e., accessibility and observability) at each logical storage element. The same problem makes this technique impractical for memory test as well. Thus, more efficient techniques are required for the testing of circuits.

Another known technique for circuit testing is signature analysis. Known test data patterns are again used to stimulate logic or memory circuits. Data outputted from the stimulated circuits are then fed into a logic circuit which compresses the data into a data signature. The data signature is then compared to the data signature which would result had the logic or memory circuits functioned properly. Examples of such signature analysis can be seen in U.S. Pat. Nos. 4,597,080 and 4,601,034.

The advantage of signature analysis over simple deterministic testing is the compression of the outputted test data. The storing of test data for each output response is no longer required, thereby reducing tester complexity and test data volume. Although this feature also prevents the ability to easily determine the precise location of a circuit failure, such is irrelevant because the high circuit density and low cost of integrated circuit chips has made it impractical to repair a detected failure. Instead, a failed chip is discarded and another substituted in its place.

Despite the aforementioned advantages, signature analysis is not a sufficiently efficient technique for testing the circuit densities achievable today. Large amounts of circuits are still required to initialize highly dense logic and memory circuits. Recent techniques for testing logic circuits are disclosed in U.S. Pat. Nos. 4,513,418 and 4,519,078. These techniques employ a random pattern generator, including a linear feedback shift register, provided with known seed data (not all zeros) to apply a set of data patterns to test LSSD logic circuits. A random pattern generator cycle is herein defined as the period of time beginning with seeding and ending when the seed data reappears in the shift register. The efficient generation of memory addresses requiring initialization is a particular problem heretofore not resolved by these techniques. A random pattern generator simply having the same number of stages as there are address lines required for memory addressing will not cycle through all memory addresses. For example, the exclusive OR gate(s) in the feedback loop inevitably receive and therefore return a logical one to the initial stage of the shift register, thereby preventing the generation of the memory address consisting of all zeros. This is good in the sense that the presence of all zeros in the shift register would cause the random pattern generator to repeat the all zero state because the exclusive OR gate feedback loop would never generate anything but additional zeros. However, the all zero address must still be generated for complete testing. Thus, a simple system and method for generating the memory address consisting of all zeros is required.

The inability of linear feedback shift registers to generate patterns including the all zero state has been recognized. One publication merely recommends modification of the shift register without further specification. McCluskey, E. J., "Built-In Self-Test Techniques," *IEEE Design and Test*, April, 1985, pp. 21–28. Another publication suggests modification of the existing stages or feedback loop of the shift register to generate the all zero state. Wang, L. and McCluskey, E. J., "Feedback Shift Registers For Self-Testing Circuits," *VLSI Systems Design*, Dec., 1986, pp. 50–58 and McCluskey, E. J. and Bozorgui-Nesbat, S., "Design for Autonomous Test," *IEEE Transactions on Computers*, Vol. c-30, No. 11, November, 1981, pp. 866–875. However, the proposed modifications render the shift register non-linear or the feedback loop more complex than a simple exclusive OR gate. Thus, these publications do not solve the aforementioned problems.

Regarding logic testing only, the addition of a stage to a linear feedback shift register has been proposed to allow for an all zero output window. Bardell, P. H. and McAnney, W. H., "Pseudorandom Arrays for Built-In Tests," *IEEE Transactions on Computers*, Vol. c-35, No. 7, July, 1986, pp. 653–58. The output window is an array of data, the rows of which are formed from the data present in some of the stages of the shift register at various times during the data pattern. However, the array is generated inefficiently, using only a small portion of the existing stages of the shift register. This is because the proposal is directed to the generation of the all zero state in the entire array, not the generation of an all zero state in the shift register. The number of stages in the shift register do not correspond to the number of lines needed for addressing, and are reduced only by a complex logic circuit for inputting data from the shift register into the array. Furthermore, the complexity of the logic circuit makes it difficult to adapt to a particular memory size. Thus, no simple manner is heretofore known for providing a random pattern generator with the capability of cycling through all memory addresses.

SUMMARY OF THE INVENTION

In view of the foregoing, it is the principle object of this invention to improve systems and methods for memory self-test.

Another object of this invention is a system and method for on-chip memory self-test.

Still another object of this invention is a system and method for on-chip memory self-test which also provides for on-chip logic self-test.

Still another object of this invention is a system and method for efficiently generating test data patterns for memory self-test which account for each memory address.

Still another object of this invention is a system and method for efficiently generating test data patterns for memory self-test which account for both the zero and one memory data states.

These and other objects of this invention are accomplished using a random pattern generator (RPG) configuration including a linear feedback shift register containing at least one more stage than address lines needed for addressing the memory. The data from the additional RPG stages are not used in so far as memory addressing is concerned. The RPG design is based upon a primitive polynomial. Such a RPG ensures that cycling through all possible combinations of the test data patterns accounts for each memory address in the memory circuits, including the address of all zeros. The all-zero address is accounted for when the RPG generates all zeros, except for a ones) in at least one of the additional stage(s) of the shift register.

In operation, the RPG is first seeded with known test data, not all zeros, the MISR with known data, and the memory data input shift register with the final N bits from the RPG as if the RPG had just finished a complete cycle using the intended seed. During a first RPG cycle, each memory address is generated and data written into that address, so that data is initialized into each memory cell. During the next RPG cycle, data from each memory cell is outputted to a multiple input signature register (MISR). During yet another RPG cycle, the complement of the data initialized into memory during the first RPG cycle is written into memory. A final RPG cycle causes the complement data to be outputted to the MISR. By inputting to memory both random data and its compliment, both possible data states are achieved in each memory cell. The signature generated by the MISR is then compared to that known for a good memory array. Although the failure of a memory circuit element cannot be precisely located, such is irrelevant because the failure cannot practically be repaired on-chip. Instead, the failed chip is discarded and replaced. Logic testing uses the same RPG as for memory testing, employing LSSD techniques.

The foregoing and other objects, features, and advantages of the invention will be apparent from the following more particular description of the preferred embodiment of the invention, as illustrated in the accompanying drawing.

DESCRIPTION OF THE PREFERRED EMBODIMENT

Figure 1:
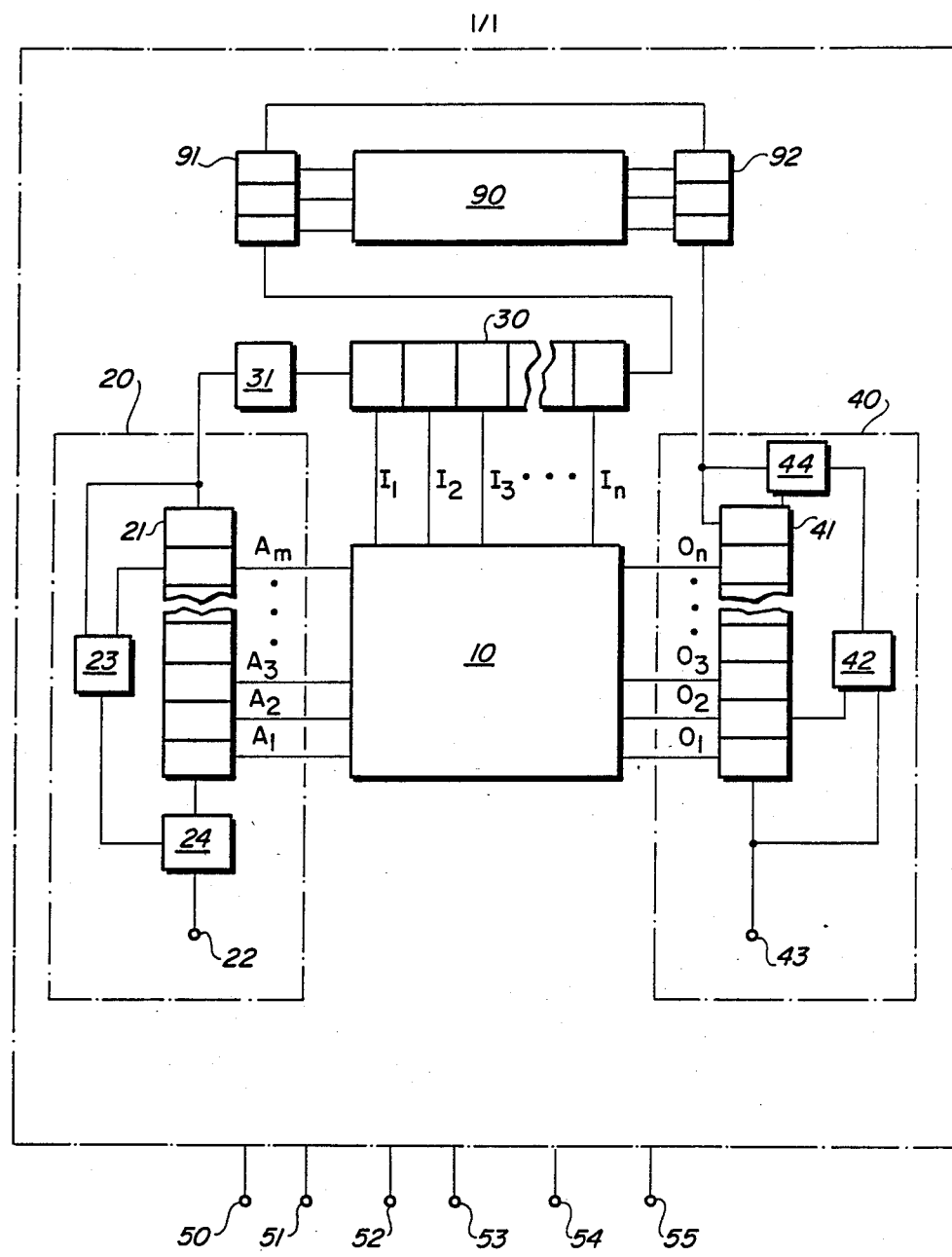
FIG. 1 is a schematic system diagram of the preferred embodiment of the invention.

Referring to FIG. 1, the system for self-test of memory circuits 10 and logic circuits 90 will now be described. Memory circuits 10 include an array of data words each containing "n" bits. Data is written into memory 10 via input lines $I_1, I_2, I_3 .. I_n$ and read out from memory 10 via output lines $O_1, O_2, O_3 .. O_n$. Memory addressing during read/write operations is accomplished via "m" address lines $A_1, A_2, A_3 .. A_m$. Memory 10 can therefore contain up to $2^m$ word lines and up to $(2^m \times n)$ memory cells. The testing circuits can thus be adapted for any size memory, the exact values of m and n being significant only as stated herein.

Address data for memory 10 are generated by RPG 20. Seed data can be entered into shift register 21 of RPG 20 via input node 22. Data exiting different stages of shift register 21 are inputted into exclusive OR gate 23, the output of which is rerouted as input data back into shift register 21 via multiplexer 24. RPG 20 is thus capable of cycling through a set of pseudo-random data patterns. By pseudo-random it is meant that the data patterns are random only in so far as the selection of the seed data and the configuration of the feedback path of the RPG. Provided the same seed data are always used, the test patterns are repeatable.

The design of RPG 20 is based upon a "primitive polynomial." The stages of shift register 21 which are used to generate feedback to form the next state can be described by a polynomial. For a shift register with z stages, the feedback will be described by a zth degree polynomial. The remainder of the polynomial describes the feedback loop of the RPG. Feedback from the last stage of the shift register would be a "1" ($x^0$), feedback from the next to last stage of the shift register would be an "x" ($x^1$), and so on. For example, a four stage shift register having feedback from the last two stages would be described by the polynomial "$x^4 + x + 1$." If the zth degree characteristic polynomial p(x) is irreducible (i.e. cannot be factored) and if:

$$\frac{x^y - 1}{p(x)} = 0 \bmod p(x) \quad \text{for } y = 2^z - 1$$
$$\frac{x^y - 1}{p(x)} = \text{anything but 0} \bmod p(x) \quad \text{for } y < 2^z - 1$$

then p(x) is a primitive polynomial. At least one primitive polynomial of degree z exists for every possible value of z. Examples of primitive polynomials are available in table form in various references. See, Peterson, W. W., and Weldon, E. J., *Error Correcting Codes*, 2nd Ed., 1972. Sample primitive polynomials are $x^4+x^3+1$, $x^5+x^2+1$, $x^{18}+x^7+1$, $x^{21}+x^2+1$, and $x^{31}+x^3+1$. Thus, the actual configuration of RPG 20 may vary according to the size of shift register 21.

A random pattern generator based on a primitive polynomial and having z stages will generate ($2^z-1$) states if permitted to cycle through all possible data states. All data states are generated except for the all zero state. The all zero state cannot be generated because feedback from a data "1" in the shift register must inevitably regenerate another data "1". Thus only ($2^z-1$) states can actually be generated. Note that shift register 21 contains at least one stage in addition to the number of address lines m (i.e., a total of at least (m+1) stages, or z>m). Because of this feature, the all zero address of memory 10 can be generated. Although all of the stages of shift register 21 cannot be in the zero state simultaneously, as mentioned, the stages connected to the address lines will at some point during cycling all be in the zero state while at least one of the remaining stages (those not connected to the address lines) is in the "1" state.

Data exiting the last stage of shift register 21 are also routed through switchable inverter 31 to shift register 30. Shift register 30 has n stages connected to n input lines, permitting the input of words composed of n bits into memory 10. Data exiting the last stage of shift register 30 are routed through shift register 91. From shift register 91, data will propagate through logic circuits 90 to shift register 92. Shift registers 91 and 92 are designed according to LSSD criteria such as shown in U.S. Pat. Nos. 3,761,695 and 3,783,254, hereby incorporated by reference.

Data from shift register 92 and memory 10 are routed to MISR 40. Shift register 41 has at least (n+1) stages connected to n output lines, permitting the output of words composed of n bits to MISR 40 from memory 10, and output from shift register 92. Data exiting different stages of shift register 41 of MISR 40 are inputted into exclusive OR gate 42, the output of which is rerouted as input data back into shift register 41 via multiplexer 44. Data may be outputted from shift register 41 via output node 43. RPG 20, input shift register 30, and MISR 40 are designed according to LSSD criteria, except so far as the aforementioned number of stages of shift register 21, so as to permit initialization. The stages of shift registers 21, 30, and 41 are shown by the boxes therein in FIG. 1, as connected to the address, input, and output lines respectively.

Clocks 50–53 control the operation of the entire system. System clocks 50 and 51 control operations involving memory 10 and logic 90 respectively. These clocks and read/write select switch 54 determine whether data will be written into or read out of memory circuits 10 and whether results will be captured from logic circuits 90. Shift clocks 52 and 53 control the shifting of data through shift registers 21, 30, 41, 91, and 92 and operate RPG 20 and MISR 40 in test mode. Mode select 55, Scan or Test, configures the system for scanning data into the shift registers or operating in test mode to test logic 90 or memory 10. As shown, the entire system of FIG. 1 may be integrated into the workings of a microchip to permit on-chip self-test.

Method of Operation

Referring to FIG. 1, the method of self-testing memory circuits 10 and logic circuits 90 will now be described. In the system mode of operation (i.e. no testing), the system is responsive to system clocks 50 and 51 only. To test the system, seed data must be entered into RPG 20, shift registers 30, 91, 92 and MISR 40. Seeding is performed by setting mode select 55 to scan mode and switching system control over to shift clocks 52 and 53 and activating input node 22 to permit data to be scanned through the system. In this way, known data is present in RPG 20, shift register 30, 91, 92 and MISR 40 at the beginning of testing.

Test mode begins once seeding is complete, using both system clocks 50 and 51, shift clocks 52 and 53, and mode select 55 to control the operation of the system. Read/write select switch 54 is used to determine whether data are being written into or read out of memory 10. Test mode includes at least four cycles of RPG 20. A RPG cycle comprises the shifting of data through shift register 21, exclusive OR gate 23, and back into shift register 21 until all possible combinations of binary data have passed through the stages of shift register 21. Multiplexer 24 controls node 22 to permit seeding (scan mode) or data feedback (test mode). Since shift register 21 has (m+1) stages, the number of possible data combinations which must pass through shift register 21 is $2^{(m+1)} - 1$.

To test memory circuits 10, each memory cell in the memory array must be initialized. This is accomplished using RPG 20 and shift register 30. The data present in shift register 30 are input into memory 10 at the memory address simultaneously represented by the data present in the appropriate stages of shift register 21. Thus, during the first RPG cycle all memory cells are written to at least once. Since RPG 20 has at least one additional stage compared to the number of memory address lines, RPG 20 does test the address consisting of all zeros. Although the additional stage will cause RPG 20 to cycle through some memory addresses more than once, this loss in efficiency is relatively small compared to the gains (in chip space, test data volume, and operating speed) achieved by avoiding the carry bit logic necessary for addressing when employing deterministic testing. During the first RPG cycle, data also passes through shift registers 30, 91, and 92 and into MISR 40. System clock 51 is deactivated to assure that data is not input to shift register 92 during the testing of memory. The outputs of memory 10 must always be in a known, repeatable state, for example all zeros, during all non-read operations.

After initialization is complete, the known data stored in memory circuits 10 is outputted to MISR 40. Data output is accomplished during a second RPG cycle, similar to the first such cycle except that data is now read out of rather than into memory 10. As data recycles through MISR 40, it is modified with each passing through exclusive OR gate 42. Although data has also reached MISR 40 from shift register 92, it too is known data which recycles around MISR 40. Thus, when RPG 20 has completed cycling through all memory addresses, a predictable set of data will remain in shift register 41.

The first two RPG cycles account for one of two data states for each individual memory cell of memory 10. To test for both possible data states at each memory address, the aforementioned testing must be repeated using data which is the compliment of that initialized into memory 10 during the first RPG cycle. Testing is thus repeated using the same test data patterns, but particular memory cells previously initialized with to the zero state must now be written with the one state and vice versa. Complimentary writing is accomplished during a third RPG cycle which is identical to the first RPG cycle, except that switchable inverter 31 was activated during the second RPG cycle to assure that the complement data is available at the beginning of the third RPG cycle. Data which are outputted from RPG 20 to shift register 30 during the third RPG cycle are thus the compliment of the data so transferred during the first RPG cycle.

A fourth RPG cycle is required to again output the known data in memory 10 to MISR 40. This RPG cycle is identical to the second RPG cycle except for the differences in the data shifted. Since the status of the system is always determinable so long as known seed data are used, the data in shift register 41 are still predictable.

Logic circuits 90 may be tested after memory circuits 10. System clock 51 allows data outputted from RPG 20, through shift register 30, and on to shift register 91 to propagate through logic circuits 90, and be captured in shift register 92. Data outputted from logic circuits 90 to shift register 92 are then inputted to MISR 40. When logic testing is complete, a predictable set of data will be present in the stages of shift register 41. This output signature is then outputted through node 43 and compared to that predicted for properly operating memory 10 and logic 90, using the same seed data. Multiplexer 44 operates to permit scan input from shift register 92 or data feedback through exclusive OR gate 42. If the compared signatures match, the tested circuits are satisfactory. If there is no match, the chip containing the circuits is discarded and replaced.

The aforementioned method of operation is described as generating a single signature in testing both memory circuits 10 or logic circuits 90. Several variations of this method of operation can also be performed. Logic circuits 90 can be tested before memory circuits 10 (and not after), so long as the expected data signature was based similarly and the output of the memory is controlled so as not to corrupt the signature in MISR 40. In addition, data signatures can be outputted for comparison with a known signature at any time during the testing, if so desired. For example, a separate signature comparison can be made for memory 10 (after the fourth RPG cycle) and for logic 90 (after scanning data there through). Similarly, the logic testing portion of the system (logic circuits 90 and shift registers 91 and 92) can be eliminated altogether. Such a system would be capable of memory self-test only. Finally, logic and memory testing can be performed simultaneously if MISR 40 is made large enough. The problem with simultaneous testing is the loss of chip space required for a MISR capable of accepting data from both logic testing and memory testing simultaneously.

While the invention has been particularly shown and described with reference to a preferred embodiment thereof, it will be understood by those skilled in the art that various changes in form and details may be made therein without departing from the spirit and scope of the invention. For example, FIG. 1 shows only one exclusive OR gate 42 in a single configuration in MISR 40, but the actual number and configuration may be different. Although these features will determine the outputted data signature, such data signature should always be the same for a properly operating circuit tested with the same seed data. RPG 20 may vary similarly.

What is claimed is:

1. A method for self-test of logic circuits and memory circuits having a random pattern generator connected to input lines of the logic circuits and address lines and data input lines of the memory circuits, the random pattern generator including means for stepping through each memory address during a random pattern generator cycle, the logic and memory circuits having a multiple input signature register connected to output lines thereof, comprising:
   providing the random pattern generator with known seed data;
   writing data into the memory circuits during a first random pattern generator cycle;
   outputting data from the memory circuits to the multiple input signature register during a second random pattern generator cycle;
   writing data into the memory circuits during a third random pattern generator cycle, the data written during the third random pattern generator cycle being the complement of the data written during the first random pattern generator cycle;
   outputting data from the memory circuits to the multiple input signature register during a fourth random pattern generator cycle;
   scanning data through the logic circuits and into the multiple input signature register; and
   comparing the data signature in the multiple input signature register with that which would be generated by properly operating logic and memory circuits provided with the same seed data.

2. The method of claim 1 wherein the step of scanning data through the logic circuits and into the multiple input signature register is performed before the four random pattern generator cycles.

3. The method of claim 1 wherein the step of scanning data through the logic circuits and into the multiple input signature register is performed after the four random pattern generator cycles.

4. The method of claim 1 wherein the step of scanning data through the logic circuits and into the multiple input signature register is performed during at least one of the four random pattern generator cycles.

5. A system for memory self-test comprising:

a memory array having address lines, input lines, and output lines;

a multiple input signature register connected to the output lines of the memory array;

a random pattern generator based upon a primitive polynomial and connected to the address lines and input lines of the memory array, the random pattern generator having at least one stage in addition to the number of address lines; and a switchable inverter connected between the random pattern generator and the input lines of the memory array.

6. A system for logic and memory self-test comprising:

a memory array having address lines, input lines, and output lines;

a multiple input signature register connected to the output lines of the memory array;

a random pattern generator based upon a primitive polynomial and connected to the address lines and input lines of the memory array, the random pattern generator having at least one stage in addition to the number of address lines; and logic circuits connected between the random pattern generator and the multiple input signature register.

7. The system of claim 6, further comprising a switchable inverter connected between the random pattern generator and the input lines of the memory array.

8. A system for memory self-test comprising:

a memory array having address lines, input lines, and output lines;

a multiple input signature register connected to the output lines of the memory array; and a random pattern generator based upon a primitive polynomial and connected to the address lines and input lines of the memory array, each stage of the random pattern generator connected to no more than one address line of the memory array, the random pattern generator having at least one stage in addition to the number of address lines, said at least one stage not connected to the address lines of the memory array, the contents of the stages of the random pattern generator connected to the address lines of the memory array representing a memory address.

9. The system of claim 8 wherein each address line of the memory array is connected to exactly one stage of the random pattern generator.

10. The system of claim 8 wherein the random pattern generator has exactly one stage in addition to the number of address lines.

* * * * *